US006478484B1

(12) United States Patent
Singh

(10) Patent No.: US 6,478,484 B1
(45) Date of Patent: Nov. 12, 2002

(54) FEED-FORWARD MECHANISM FROM LATENT IMAGES TO DEVELOPER SYSTEM FOR PHOTORESIST LINEWIDTH CONTROL

(75) Inventor: Bhanwar Singh, Morgan Hill, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 39 days.

(21) Appl. No.: 09/707,853

(22) Filed: Nov. 7, 2000

Related U.S. Application Data

(60) Provisional application No. 60/242,575, filed on Oct. 24, 2000.

(51) Int. Cl.⁷ .............................. G03D 5/00; G03C 5/00
(52) U.S. Cl. ...................... 396/611; 396/567; 396/571; 118/58
(58) Field of Search .................. 396/611, 567, 396/568, 571; 430/30, 320; 355/27; 250/492.1, 492.2; 118/58, 69, 111, 232

(56) References Cited

U.S. PATENT DOCUMENTS

| | | | | |
|---|---|---|---|---|
| 5,283,141 A | * | 2/1994 | Yoon et al. | ............... 250/492.1 |
| 5,917,588 A | * | 6/1999 | Addiego | ................... 356/237.2 |
| 5,968,693 A | * | 10/1999 | Adams | ........................ 430/30 |
| 6,051,349 A | | 4/2000 | Yoshioka et al. | |
| 6,133,576 A | * | 10/2000 | Shafer et al. | ............. 250/458.1 |

* cited by examiner

Primary Examiner—Alan A. Mathews
(74) Attorney, Agent, or Firm—Amin & Turocy, LLP

(57) ABSTRACT

The present invention provides lithographic systems and lithographic processes in which conditions affecting critical dimensions are controlled based on a latent image signature. The latent image signature characterizes the latent pattern present in a resist coating after selective exposure of the resist to actinic radiation. The latent image signature is determined from the full latent pattern within a region of the resist. Conditions for subsequent processing steps (feed forward control) and/or prior processing steps (feed back control) to produce desired critical dimensions are determined from the latent image signature. In another aspect of the invention the latent pattern is logically divided into a plurality of regions. Within each region, a characteristic of the latent pattern is analyzed to determine conditions to apply to that region during previous and/or subsequent processing steps. These conditions include a condition such as post-exposure baking temperature or developing temperature that can be separately controlled for each region. Region to region variations in pattern development can thereby be corrected. The systems and processes of the invention allow more effective control of critical dimensions than prior art processes that rely on a single critical dimension measurement made on a latent pattern.

9 Claims, 8 Drawing Sheets

FEED-FORWARD MECHANISM FROM LATENT IMAGES TO DEVELOPER SYSTEM FOR PHOTORESIST LINEWIDTH CONTROL

CROSS REFERENCE TO RELATED APPLICATIONS

This application claims the benefit of U.S. Provisional Patent Application Serial No. 60/242,575, filed Oct. 24, 2000, entitled FEED-FORWARD MECHANISM FROM LATENT IMAGES TO DEVELOPER SYSTEM FOR PHOTORESIST LINEWIDTH CONTROL.

TECHNICAL FIELD

The present invention relates generally to semiconductor processing, and in particular to lithographic processes and lithography systems.

BACKGROUND OF THE INVENTION

In the semiconductor industry, there is a continuing trend toward higher device densities. To achieve these higher device densities there have been, and continue to be, efforts toward scaling down the device dimensions on semiconductor wafers. In order to accomplish higher device densities, smaller and smaller features sizes are required. These may include the width and spacing of interconnecting lines, spacing and diameter of contact holes, and surface geometry of corners and edges of various features.

High resolution lithographic processes are used to achieve small features. In general, lithography refers to processes for pattern transfer between various media. In lithography for integrated circuit fabrication, a silicon slice, the wafer, is coated uniformly with a radiation-sensitive film, the resist. The film is selectively exposed with radiation (such as optical light, x-rays, or an electron beam) through an intervening master template, the mask, forming a particular pattern. Exposed areas of the coating become either more or less soluble than the unexposed areas (depending on the type of coating) in a particular solvent developer. The more soluble areas are removed with the developer in a developing step. The less soluble areas remain on the silicon wafer forming a patterned coating. The pattern corresponds to the image of the mask or its negative. The patterned resist is used in further processing of the silicon wafer.

Critical dimensions of the patterned resist, such as line widths, affect the performance of the finished product and are sensitive to processing conditions. Processing conditions that affect critical dimensions include conditions relating to resist application, pre-baking, resist exposure, post-baking, and resist development. A few degrees variation in the pre-bake temperature, for example, can have a significant affect on critical dimensions. Many of the conditions that affect critical dimensions are difficult to control, often resulting in variations from batch to batch.

One way to deal with these variations is to adapt latter processing steps to compensate for variations that take place during earlier processing steps. In particular, feed-forward control based on measuring a critical dimension of the pattern that is latent within the resist after exposure, but prior to post-exposure baking and developing, has been suggested. This approach, however, is not entirely effective; the solubility of the resist, which defines the latent pattern, undergoes a smooth transition at pattern borders. Therefore, measurements of critical dimensions in latent patterns are imprecise and have a degree of subjectivity. Consequently, there remains an unsatisfied need for a lithographic process that provides effective adaptation of processing conditions to control critical dimensions in the patterned resist.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention provides lithographic systems and lithographic processes in which conditions affecting critical dimensions are controlled based on a latent image signature. The latent image signature characterizes the latent pattern present in a resist coating after selective exposure of the resist to actinic radiation. The latent image signature is determined from the full latent pattern within a region of the resist. Conditions for subsequent processing steps (feed forward control) and/or prior processing steps (feed back control) to produce desired critical dimensions are determined from the latent image signature. In another aspect of the invention the latent pattern is logically divided into a plurality of regions. Within each region, a characteristic of the latent pattern is analyzed to determine conditions to apply to that region during previous and/or subsequent processing steps. These conditions include a condition such as post-exposure baking temperature or developing temperature that can be separately controlled for each region. Region to region variations in pattern development can thereby be corrected. The systems and processes of the invention allow more effective control of critical dimensions than prior art processes that rely on a single critical dimension measurement made on a latent pattern.

One aspect of the present invention provides a lithography system comprising a lighting system for illuminating a substrate coated with a resist having a latent pattern, an imaging system for imaging the latent pattern to produce image data, a resist processing system, and a controller, wherein the controller regulates the resist processing system based on a parameter characteristic of the latent pattern and derived from the image data.

Another aspect of the present invention provides a lithography system, comprising means for determining a latent image signature for a latent pattern in a resist coating and means for regulating a resist processing condition based on the latent image signature.

A further aspect of the present invention provides a lithographic process comprising forming a resist coating over a substrate, selectively exposing the resist to actinic radiation to form a latent pattern within the resist coating, determining a latent image signature for the latent pattern, and post-baking, where appropriate, and developing the resist employing a condition determined based at least in part on the latent image signature.

A further aspect of the present invention provides a lithographic process comprising forming a resist coating over a substrate, selectively exposing the resist to actinic radiation to form a latent pattern within the resist coating, logically dividing the latent pattern into a plurality of portions, for each of the plurality of portions of the latent pattern, determining a parameter relating to the latent pattern, and post-baking, where appropriate, and developing the resist employing a condition that varies over the plurality of portions of the latent pattern based, at least in part, on the parameter relating to the latent pattern.

The invention extends to features hereinafter fully described and features particularly pointed out in the claims. The following detailed description and the annexed drawings set forth in detail certain illustrative examples of the invention. These examples are indicative of but a few of the various ways in which the principles of the invention may be employed. Other ways in which the principles of the invention may be employed and other objects, advantages and novel features of the invention will be apparent from the detailed description of the invention when consider in conjunction with the drawings.

DETAILED DESCRIPTION OF THE INVENTION

Figure 1A:
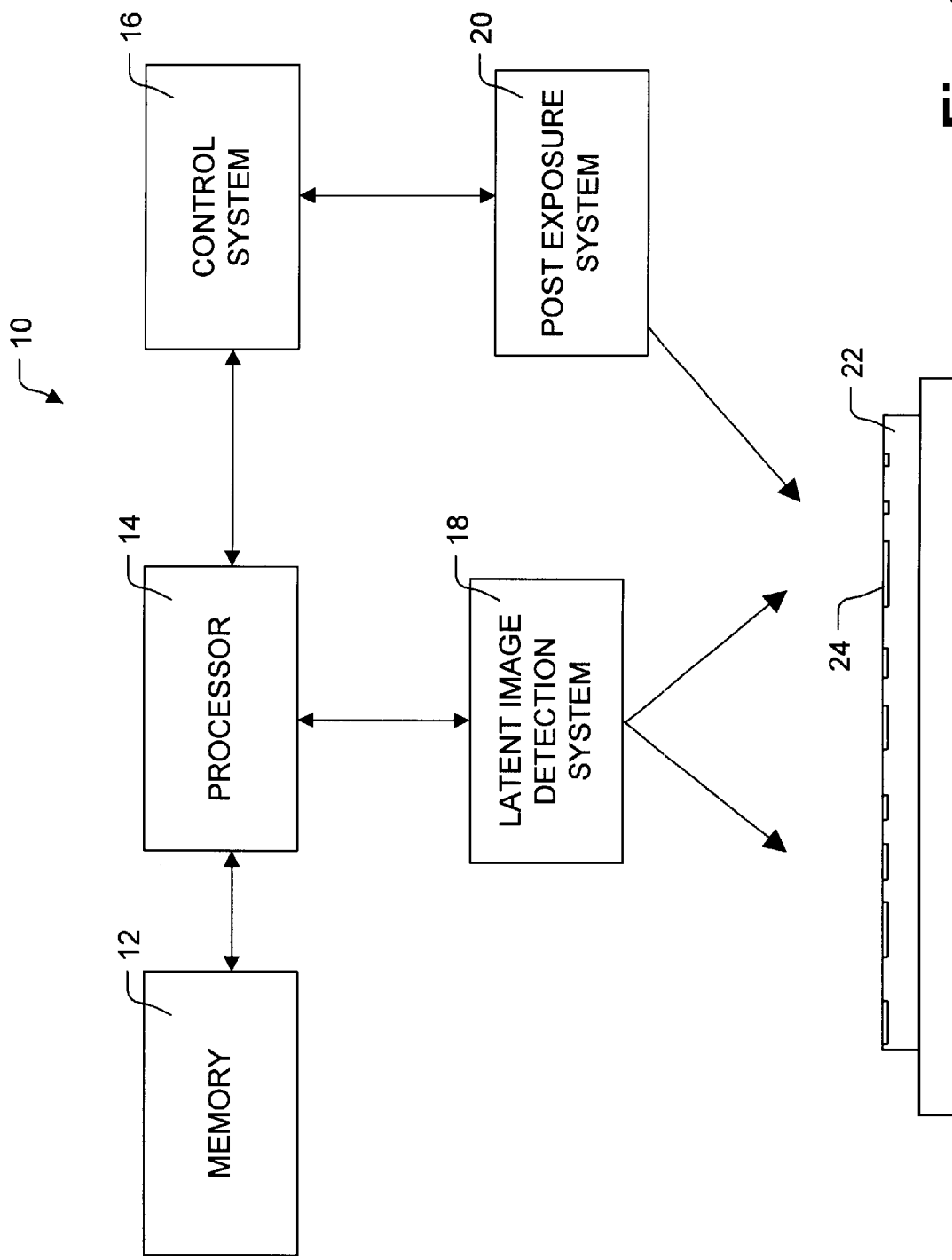
FIG. 1a is high level schematic illustration of a system provided by one aspect of the present invention.

FIG. 1a is a high level schematic illustration of a resist processing system 10 provided by one aspect of the present invention. Resist processing system 10 includes memory 12, processor 14, control system 16, latent image detection system 18, and post-exposure system 20. Latent image detection system 18 detects a latent image within the resist coating of substrate 22. Based on the latent image together with data stored in memory 12, processor 14 determines post-exposure processing conditions, such as, for example, the time the resist is exposed to developer solution, that produce desired critical dimensions in the developed resist pattern. System 10 thereby uses feed forward control to modify post-exposure processing conditions to compensate for variability in prior processing steps such as applying the resist coating, pre-baking the resist, and selectively exposing the resist to actinic radiation.

The substrate can be of any suitable type. Typically, the substrate is a semi-conducting material, a silicon wafer in particular. In addition to a semiconducting material, the substrate may include various elements and/or layers, including metal layers, barrier layers, dielectric layers, device structures, active elements and passive elements including silicon gates, word lines, source regions, drain regions, bit lines, bases emitters, collectors, conductive lines, conductive plugs, etc.

The resist, which is coated over the substrate, can also be of any suitable type. The resist can be organic or inorganic, positive or negative tone, polymeric or non-polymeric. The resist may be a photoresist responsive to visible light, ultraviolet light, or x-rays, or the resist may be an electron beam resist or an ion beam resist. The resist may be chemically amplified. Resists are commercially available from a number of sources, including Shipley Company, Kodak, Hoechst Celanese Corporation, Clariant, JSR Microelectronics, Hunt, Arch Chemical, Aquamer, and Brewer. Specific examples of resist coatings include novalacs, poly-t-butoxycarbonyloxystyrenes (PBOCOS), poly-methylmethacrylates (PMMA), poly(olephin sulfones) (POS), and poly(methyl isophenyl ketones) (PMIPK).

The resist is coated over the substrate by any suitable means. Spin coating, dip coating, or vapor deposition can be used, depending on the resist material. For example, a 157 nm sensitive photoresist, a 193 nm sensitive photoresist, an I-line, H-line, G-line, E-line, mid UV, deep UV, or extreme UV photoresist may be spin-coated on the substrate surface. After coating, the resist it typically "soft-baked" to drive off solvent, improve adhesion of the resist to the substrate, and anneal stresses caused by shear forces encountered in the spinning process.

The latent pattern is formed by selectively exposing the resist to actinic radiation through a patterned mask or reticle. The resist can be exposed all at once or section by section. The latent pattern is defined by the varying solubility of the resist that results with respect to the solvent developer. The latent pattern generally follows along the lines of the mask or reticle, but is affected by various processing conditions up to this point. For example, the latent pattern may be affected by variability in the resist formulation, variability in the thickness of the resist coating, variability in the soft bake time and temperature, and variability in the intensity and duration of the actinic radiation.

The latent image, or a portion thereof, is detected by latent image detection system 18 to provide either a latent image signature or, for each of a plurality of regions of the latent pattern, the value of a parameter indicative of the latent pattern. A latent image signature is an indicator that characterizes the latent pattern within a region of the resist, the region being the entire resist or a substantial portion thereof. The latent image signature is determined from the full latent pattern within the region, as opposed to a single point or cross-section of the latent pattern. Obtaining the latent image signature therefore involves imaging or scanning the full latent pattern within the region.

Alternatively, a parameter indicative of the latent pattern can be determined for each of a plurality of regions of the latent pattern. The parameter can be one or multi-dimensional (a vector). A good choice for the parameter is a latent image signature, however, the parameter may be a critical dimension determined from the latent pattern or some other measure taken from a point or cross-section of the latent pattern. Thus, a parameter indicative of the latent pattern is defined more broadly than a latent image signature.

In another aspect of the invention, latent image detection system 18 detects the latent pattern through illumination and imaging of the latent pattern. A light source is selected to provide uniform illumination and high contrast between exposed and unexposed portions of the resist. In this regard, dark field illumination can be used to advantage. Dark field illumination is illumination provided at an oblique angle, whereby substantially all the light detected by an imaging system is scattered from the surface rather than reflected. In another aspect of the invention, the dark field illumination has an angle of incidence on the resist surface from about 12 to about 60 degrees. In a further aspect of the invention, the angle of incidence is from about 30 to about 45 degrees. The angle of incidence may be controlled with a light control film, for example. Such films are available from 3M, among other manufacturers. Dark field illumination generally produces better contrast between more and less soluble portions of the resist.

Based on the information provided by latent image detection system 18 and data provided by memory 12, processor 14 determines subsequent processing conditions for resist coated substrate 22. The data provided by memory 12 relates latent images, or characteristics thereof, to processing conditions that result in desired critical dimensions. The data can include, for example, historical data of latent images, processing conditions, and resulting critical dimensions. As another example, the data may include functional relationships between measures of latent images and processing condition that result in desired critical dimensions. The processing conditions are passed on to control system 16, which implements those conditions through post-exposure system 20.

Post-exposure system 20 generally includes a post-baking step and a developing step. Post-baking is optional. Whether post-baking is appropriate depends on the type of resist. Critical dimensions can be affected by either or both post-baking and developing conditions. Post-baking condition that can be altered to affect critical dimensions include post-baking temperature and post-baking duration. Developing conditions that can be altered to affect critical dimensions include developer composition, development temperature, and development time. At least one condition affecting critical dimensions is determined by processor 14.

Figure 1B:
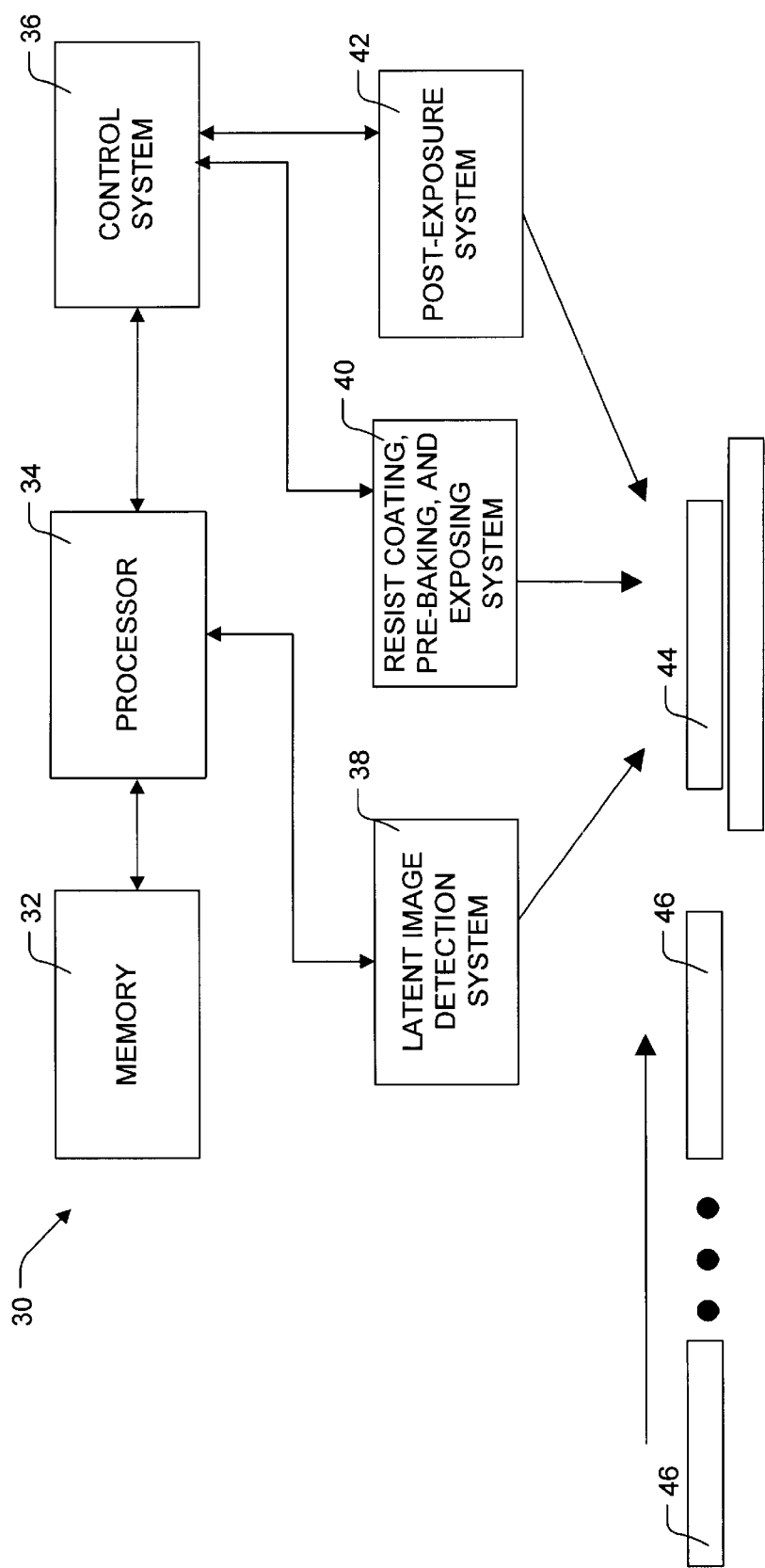
FIG. 1b is high level schematic illustration of a system provided by another aspect of the present invention.

While system 10 provides feed-forward control, the invention also includes systems that provide feed-back control. FIG. 1b provides a high level schematic of such a system 30. Resist processing system 30 includes memory 32, processor 34, control system 36, latent image detection system 38, resist coating, pre-baking, and exposing system 40, and post-exposure system 42. In general, system 30 functions in a similar fashion to system 10. Latent image detection system 38 detects a latent image within the resist coating of substrate 44. Based on the latent image, and data stored in memory 32, processor 34 determines post-exposure processing conditions, such as the, for example, time the resist is exposed to developer solution, that produce desired critical dimensions in the developed resist pattern of resist coated substrate 44. In addition, processor 34 determines adjustments to the conditions used by resist coating, pre-baking, and exposing system 40 for application to the processing of additional wafer 46 that are in a wafer processing train. System 40 thereby uses fee-back control to modify exposure and pre-exposure processing conditions to correct process drift and produce more consistent critical dimensions in patterned resists. A system of the invention can employ feed-back control alone, without feed-forward control.

Figure 2:
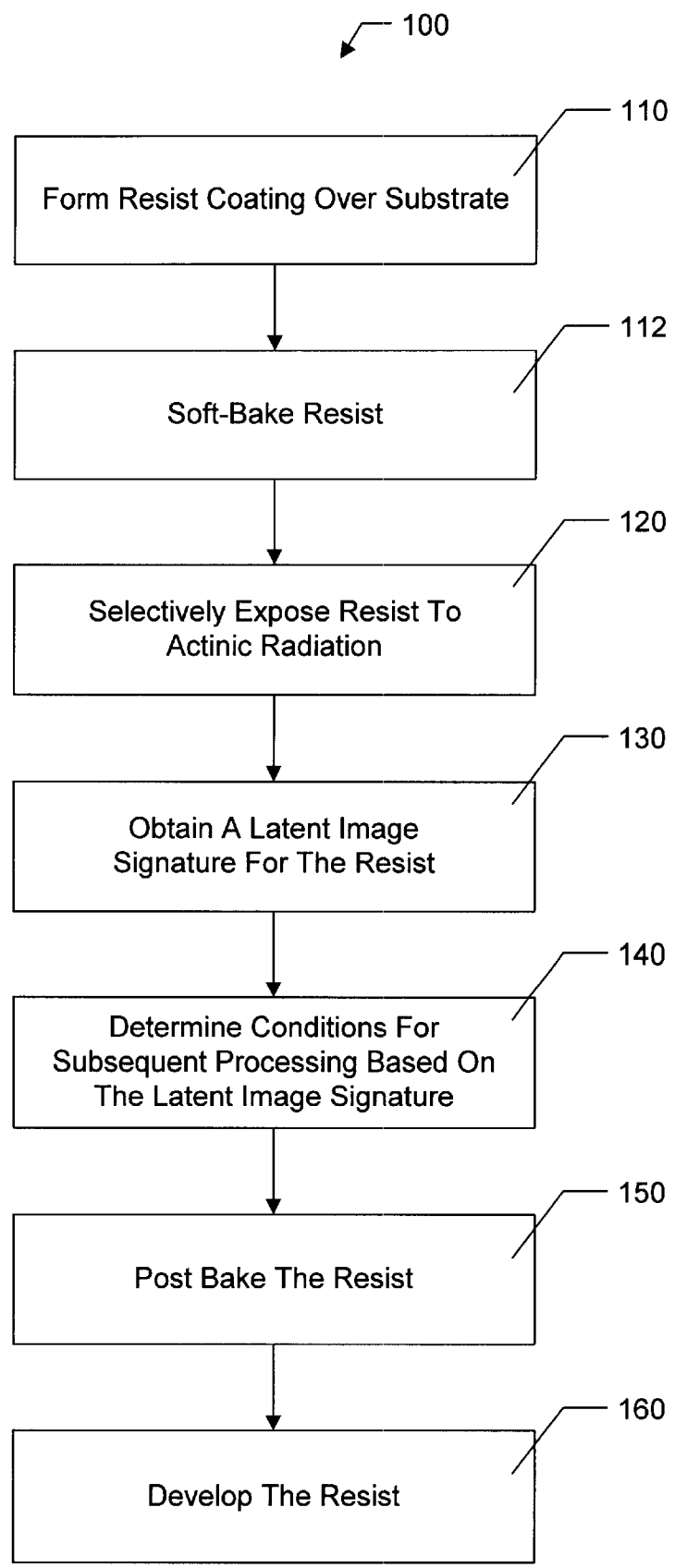
FIG. 2 is flow diagram of a process provided by a further aspect of the present invention.

A process for forming a patterned resist coating provided by another aspect of the present invention is illustrated by the flow diagram of FIG. 2. Process 100 begins with steps 110, 112, and 120 wherein a resist is coated over a substrate, soft-baked, and selectively exposed to actinic radiation through a patterned mask. After exposure, in step 130, a latent image signature is determined for the latent pattern. In step 140, the latent image signature is used to determine conditions for post-baking step 150 and/or developing step 160. The processing conditions determined in step 140 and applied in steps 150 and 160 are used to compensate for variability in processing steps 110, 112, and 120 and to thereby produce a product with consistent critical dimensions.

A latent image signature, which characterizes the latent pattern within a region of the resist, is determined in step 140. In one aspect of the invention, the latent image signature is determined from an image taken of the resist with lighting that reveals the latent pattern. Generally, the light source is non-actinic with respect to the resist. High quality images may be obtained with dark field illumination. An imaging system with variable gain and contrast can improve the comparability of images. For example, the gain and contrast may be set such that the grey levels of the brightest and darkest points are the same from image to image. The image is usually obtained by a camera, however, an image can also be constructed from a scan of the region, using reflected laser light, for example.

There are a variety of latent image signatures that can be used. For example, the proportion between light and dark areas is affected by latent image line widths. Thus, the total brightness of the image can provide the latent image signature, as can the fraction of the image data that exceeds a threshold brightness. As the line widths become narrower, light intensity changes more rapidly across pattern features. Therefore, another signature can be the square (inner product) of the light intensity gradient summed over the image. Narrower line widths are also evident in a frequency domain transformation of an image, such as an fast Fourier transform. The latent image signature can be the magnitudes of a group of frequencies or the shifting of a characteristic peak. The latent image signature can also be formulated as a composite of the forgoing signatures. The latent image signature may have one variable, a few variables, or a large number of variables.

Latent image signatures are generally specific to a particular mask pattern and a particular resist. They are generally more reliable than critical dimension measurements, for example, because latent image signatures are based on data taken over a large area, as opposed to a single point or cross-section of the latent pattern. Latent image signatures with several variables are, as a general rule, more indicative of the latent pattern.

The latent image signature is used in step 150 to determine one or more processing conditions for one or more subsequent steps. Step 150 can involve looking up the latent image signature in a historical database to find conditions that resulted in a target critical dimension in a developed resist pattern starting from a resist coating with the same latent image signature. Rather than relying on a table look-up, the relationship between the latent image signature and processing conditions can be defined more generally in terms of functional relationships. For this purpose, a neural network is well suited. The input to the neural network is the set of variables forming the latent image signature. The output is a set of processing conditions. The neural network is trained with historical data until it develops a satisfactory ability to select effective processing conditions from latent image signatures.

The processing condition determined in step 140 is applied in post-baking step 150 or developing step 160. Post-baking step 150 is optional and whether such a step is appropriate depends on the type of resist. Where a post-baking step is used, post-baking temperature and/or post-baking duration can affect critical dimensions, thus either or both post-bake temperature and post-bake duration may be determined in step 140. Processing conditions for developing step 160 that affect critical dimensions and that may be determined in step 140 include developer composition, development temperature, and development time.

Figure 3:
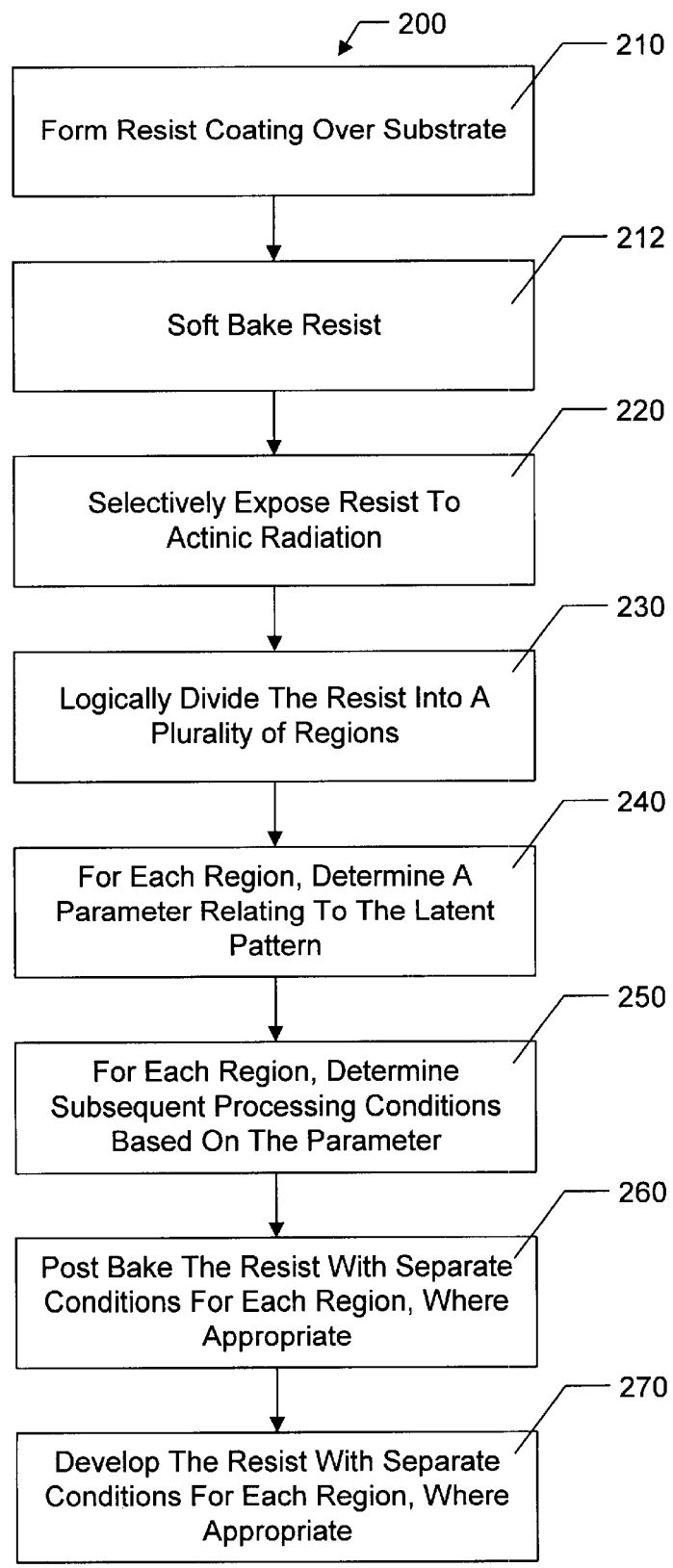
FIG. 3 is flow diagram of a process provided by a further aspect of the present invention.

A process for forming a patterned resist coating provided by another aspect of the present invention is illustrated by the flow diagram of FIG. 3. Process 200 begins like process 100 with steps 210, 212, and 220 of forming a resist coating over a substrate, soft-baking, and selectively exposing the resist to actinic radiation. In step 230, the resist is logically divided into a plurality of regions. In step 240, for each region of the resist a parameter is determined that characterizes the progress of pattern development in that region. In step 250 these parameters, which may be latent image signatures, are used to determine conditions for subsequent post-baking step 260 and/or developing step 270. One or both of steps 260 and 270 involve at least one processing condition that is separately determined in step 240 for each region of the resist. Processing conditions determined in step 240 compensate for variability in processing steps 210 and 220, including variability that occurs from region to region across the resist. Process 200 thereby results in more consistent critical dimensions for the final product.

The logical division of the resist into regions in step 230 is made based on considerations such as, for example, the pattern of variability observed in critical dimensions and the pattern of variability that can be controlled in subsequent processing steps. The logical division can be, for example, a division of the resist into concentric annular regions or a grid of square regions.

Step 240 is determining, for each region, a parameter indicative of the latent pattern within the region. The parameter can be one or multi-dimensional and can be a latent image signature. Using the parameters indicative of the latent image, one or more processing conditions for subsequent steps are determined in step 250. At least one of the processing conditions determined in step 250 is determined separately for each region of the resist.

As in process 100, the post-baking step 260 of process 200 is optional and depends on the type of resist. Where a post-baking step 260 is included, processing conditions determined in step 250 may be applicable to either or both of steps 260 and 270.

The processing condition that varies from region to region can be any processing condition that can be separately controlled for each region and affects critical dimensions in the developed resist. One such processing condition is temperature in either post-baking or developing steps.

Figure 4:
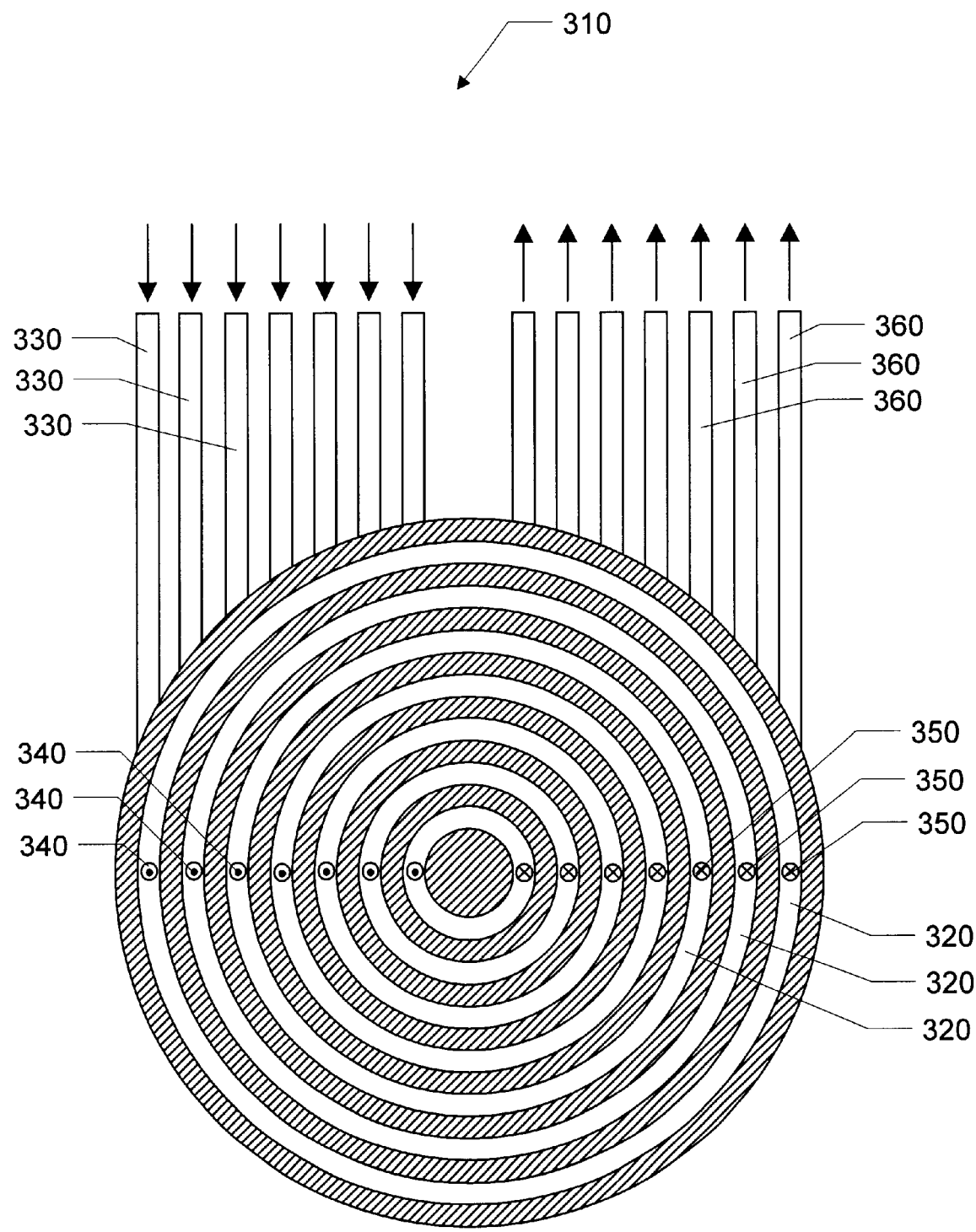
FIG. 4 is a schematic of hot plate that can be used in implementing the process of FIG. 3.
Figure 5:
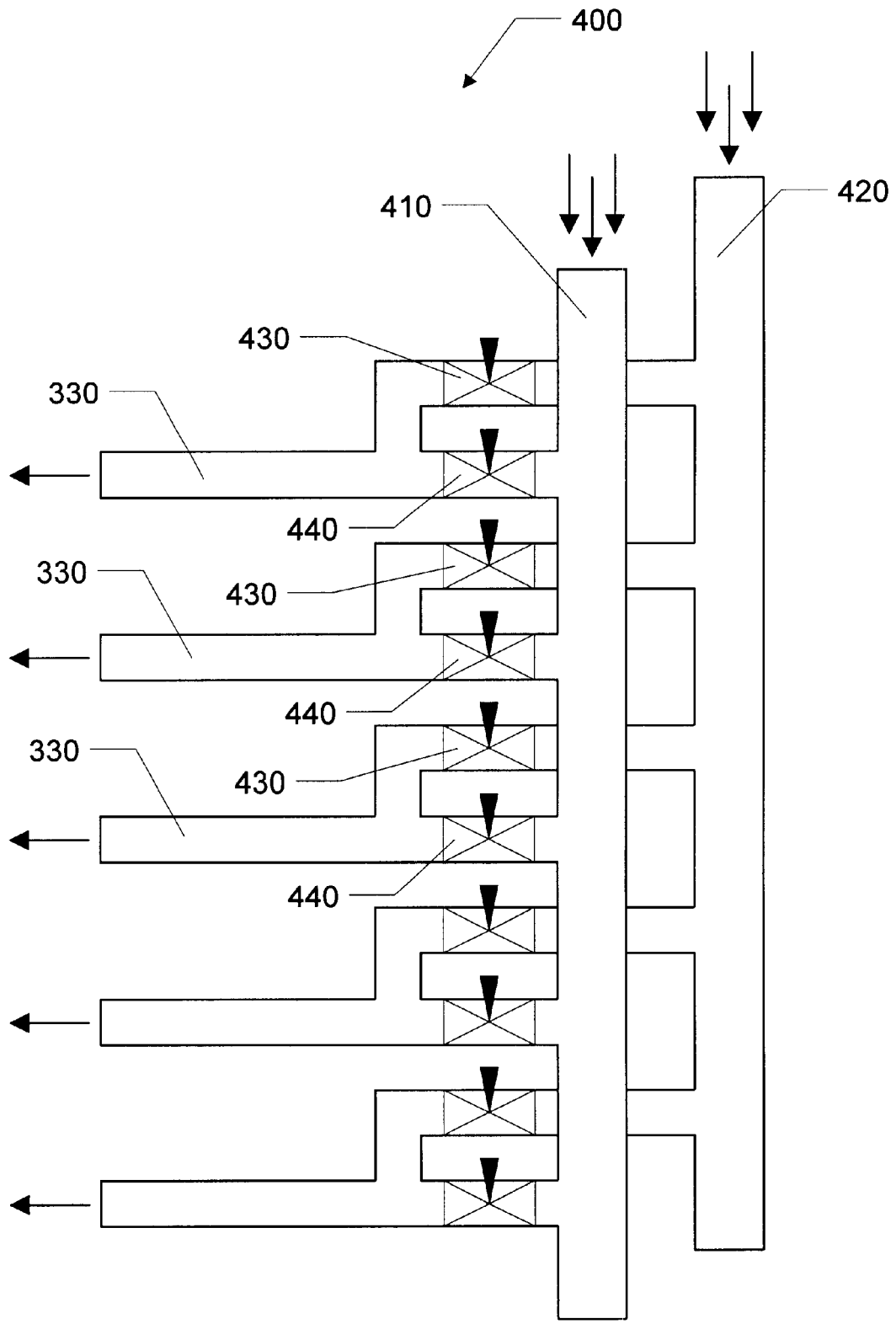
FIG. 5 is a schematic of flow control system that can be used in conjunction with the hot plate of FIG. 4.
Figure 6:
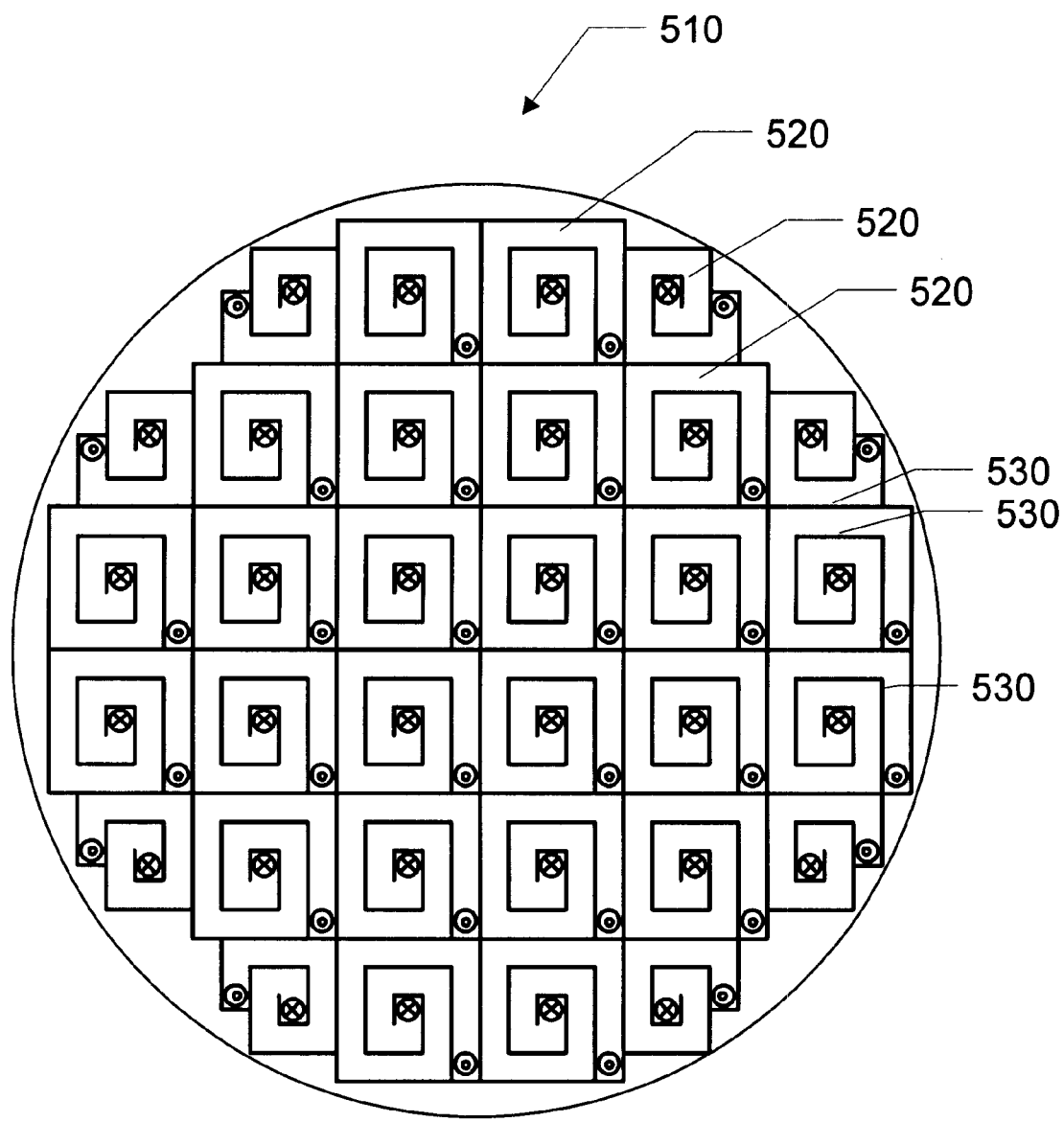
FIG. 6 is a schematic of another hot plate that can be used in implementing the process of FIG. 3.

There are a variety of methods by which temperature may be separately controlled from region to region. FIG. 4 is a schematic illustration of a hot plate 310 that permits separate temperature control for a plurality of annular regions. Fluid from tubes 330 enters annular passages 320 through entrance ports 340 and leaves through exit ports 350 and outlet tubes 360. Apparatus 400 schematically illustrated in FIG. 5 supplies each of the tubes 330 with fluid of a different temperature. Hot fluid from reservoir 410 and cold fluid from reservoir 420 enters tubes 330 through valves 430 and 440. Valves 430 and 440 may be adjusted to vary the hot/cold fluid mix and flow rate through each of the annular passages 320. FIG. 6 illustrates another hot plate 510 with passages 520 by means of which the temperature within each region of a grid of square shaped regions can be separately controlled.

Figure 7:
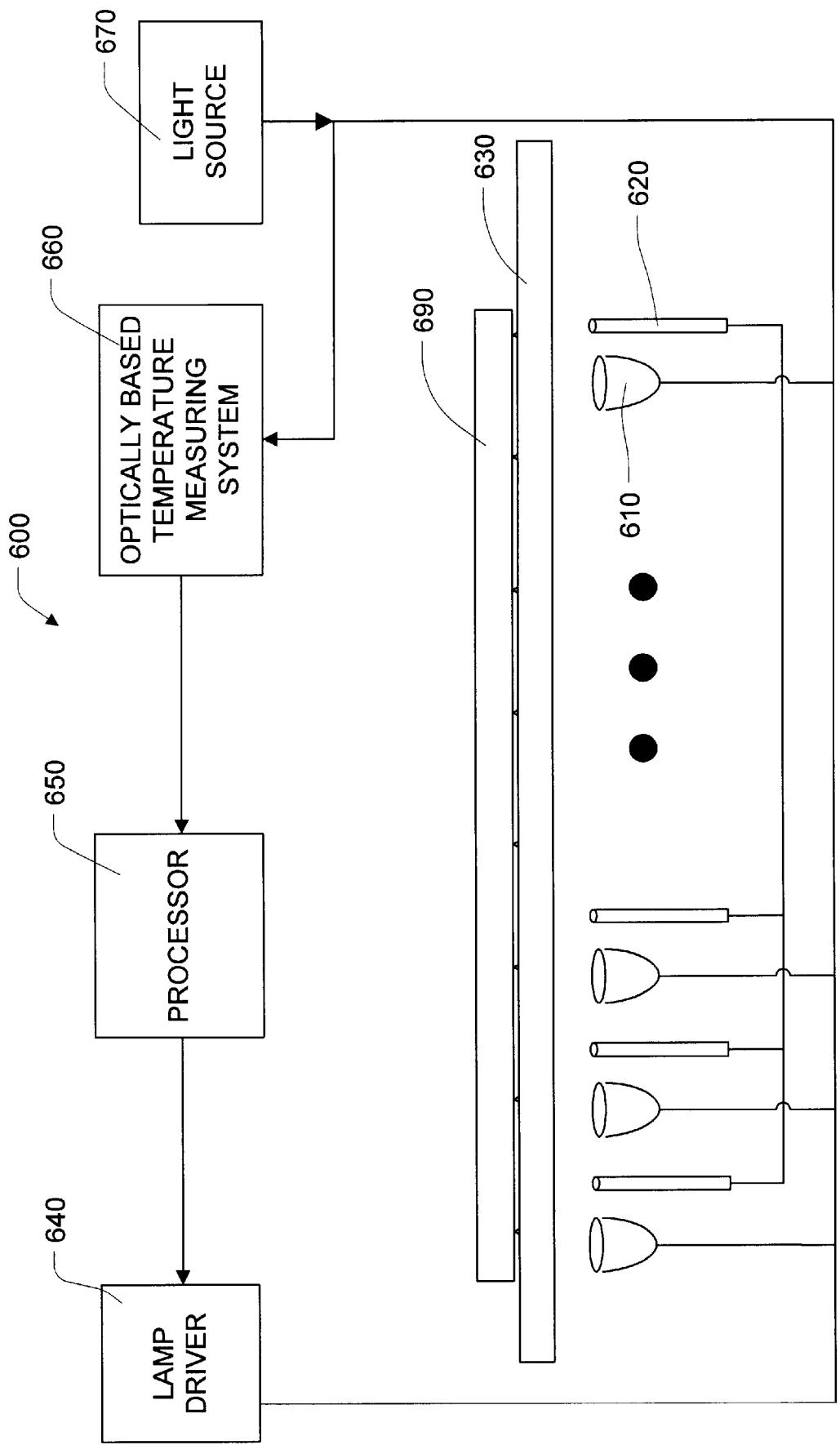
FIG. 7 is a schematic of a heating system that can be used in implementing the process of FIG. 3.

Another system for separately controlling the temperature of a plurality of regions of a resist is schematically illustrated in FIG. 7. System 600 provides a plurality of lamps 610 for heating a hot plate 630 on which the resist coated wafer 690 is placed. For temperature control, system 600 is provided with optically based temperature measuring system 660. Monochromatic radiation from light source 670 is guided to the various regions by optical fibers 620. Optical fibers 620 also have the function of gathering light that is emitted from or reflected by the surface of hot plate 630 and guiding this light to optically based temperature measuring system 660. Optically based temperature measuring system 660, which can be a spectrophotometer, an interferometer, or a colorimeter, interprets the gathered light to determine the temperatures of the hot plate corresponding to the various regions. This information is used by controller 650 to control heating lamps 610 through lamp driver 640, whereby the temperature of the various regions may be controlled. Optionally the lamps may shine directly on the resist and the temperature of the resist measured directly with a system similar to system 660.

What has been described above is the present invention and several of its specific aspects. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Furthermore, where the term "includes" has been used it is intended to be inclusive in a manner similar to the term "comprising."

What is claimed is:

1. A lithography system, comprising:
   a lighting system for illuminating a substrate coated with a resist having a latent pattern;
   an imaging system for imaging the latent pattern to produce image data;
   a resist processing system, wherein the resist processing system is configured to regulate the heat of the resist to different temperatures at different locations; and
   a controller;
   wherein the controller regulates the resist processing system based on a parameter characteristic of the latent pattern and derived from the image data.

2. The lithographic system of claim 1, wherein the lighting system provides dark field illumination.

3. The lithographic system of claim 1, wherein the controller comprises a neutral network that relates image data to conditions used in regulating the resist developing system.

4. The lithographic system of claim 1, wherein the parameter characteristic of the latent pattern is a latent image signature.

5. The lithographic system of claim 1, wherein the controller applies feed forward control to the resist processing system based on the parameter characteristic of the latent pattern and derived from the image data.

6. The lithographic system of claim 5, the controller is configured to regulate a development time for the wafer.

7. The lithographic system of claim 1, wherein the controller applies feed back control to the resist processing system based on the parameter characteristic of the latent pattern and derived from the image data.

8. A lithography system, comprising:
   means for determining a latent image signature for a latent pattern in a resist coating; and
   means for regulating a resist processing condition based on the latent image signature, wherein the means for regulating a resist processing condition is configured to regulate the heat of the resist to different temperatures at different locations.

9. The lithographic system of claim 8, wherein the resist processing condition is a condition used in post-baking and/or developing the resist coating for which the latent image signature was determined.

* * * * *